United States Patent
Wu

(10) Patent No.: US 11,705,898 B2
(45) Date of Patent: Jul. 18, 2023

(54) OFF CHIP DRIVER CIRCUIT, OFF CHIP DRIVER SYSTEM, AND METHOD FOR MANUFACTURING AN OFF CHIP DRIVER CIRCUIT

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 200 days.

(21) Appl. No.: 17/153,897

(22) Filed: Jan. 21, 2021

(65) Prior Publication Data
US 2022/0231678 A1    Jul. 21, 2022

(51) Int. Cl.
*H03K 17/042*  (2006.01)
*H03K 3/012*  (2006.01)
*H01L 21/8238*  (2006.01)

(52) U.S. Cl.
CPC ... *H03K 17/04206* (2013.01); *H01L 21/8238* (2013.01); *H03K 3/012* (2013.01)

(58) Field of Classification Search
CPC ....... G11C 7/1057; G11C 7/1051; G11C 7/10; G11C 7/00; G11C 29/023; G11C 29/022; G11C 29/02; G11C 29/00; H03K 19/0005; H03K 19/00; H03K 19/0002; H03K 19/0008
See application file for complete search history.

(56) References Cited

U.S. PATENT DOCUMENTS

| | | | |
|---|---|---|---|
| 7,961,001 B1* | 6/2011 | Ko | G11C 7/02 326/26 |
| 9,397,661 B2* | 7/2016 | Ha | H03K 19/00369 |
| 10,432,181 B2* | 10/2019 | Chen | H03K 5/24 |
| 2015/0171863 A1 | 6/2015 | Ha | |
| 2016/0134285 A1 | 5/2016 | Ha | |
| 2017/0154668 A1 | 6/2017 | Ha | |

* cited by examiner

*Primary Examiner* — Diana J. Cheng
(74) *Attorney, Agent, or Firm* — CKC & Partners Co., LLC

(57) ABSTRACT

An off chip driver circuit includes a first power rail, a second power rail, an input/output pad, a pull-up circuit, a pull-down circuit. The pull-up circuit is configured to selectively activate at least one of charging paths between the first power rail and the input/output pad. The pull-up circuit includes a first resistor and PMOS transistors arranged on the charging paths, and the first resistor is coupled between the first power rail and the PMOS transistors. The pull-down circuit is configured to selectively activate at least one of discharging paths between the second power rail and the input/output pad. The pull-down circuit includes a second resistor and NMOS transistors arranged on the discharging paths, and the second resistor is coupled between the second power rail and the NMOS transistors.

20 Claims, 14 Drawing Sheets

OFF CHIP DRIVER CIRCUIT, OFF CHIP DRIVER SYSTEM, AND METHOD FOR MANUFACTURING AN OFF CHIP DRIVER CIRCUIT

BACKGROUND

Technical Field

The disclosure relates to an off chip driver circuit, an off chip driver system, and a method for manufacturing an off chip driver circuit particularly to an off chip driver circuit, an off chip driver system, and a method for manufacturing an off chip driver circuit for improving signal distortion.

Description of Related Art

With development of technology, the operation speed of the memory becomes faster and faster. In high speed data transmission, the amplitude of signal is attenuated, causing signal distortion.

Therefore, how to improve signal distortion in high speed data transmission is an important issue in this field.

SUMMARY

One aspect of the present disclosure is an off chip driver circuit including a first power rail, a second power rail, an input/output pad, a pull-up circuit, and a pull-down circuit. The pull-up circuit configured to selectively activate at least one of charging paths between the first power rail and the input/output pad, wherein the pull-up circuit includes a first resistor and PMOS transistors arranged on the charging paths, and the first resistor is coupled between the first power rail and the PMOS transistors. The pull-down circuit configured to selectively activate at least one of discharging paths between the second power rail and the input/output pad, wherein the pull-down circuit includes a second resistor and NMOS transistors arranged on the discharging paths, and the second resistor is coupled between the second power rail and the NMOS transistors.

Another aspect of the present disclosure is an off chip driver system including an off chip driver (OCD) front-end driver circuit and an off chip driver circuit. The front-end driver circuit configured to generate a pull-up control signal and a pull-down control signal. The off chip driver circuit coupled to the front-end driver circuit and receive the pull-up control signal and the pull-down control signal from the front-end driver circuit, wherein the off chip driver circuit includes a first power rail, a second power rail, an input/output pad, a pull-up circuit, and a pull-down circuit. The pull-up circuit configured to selectively activate at least one of charging paths between the first power rail and the input/output pad in response to the pull-up control signal, wherein the pull-up circuit includes a first resistor and PMOS transistors arranged on the charging paths, and the first resistor is coupled between the first power rail and the PMOS transistors. The pull-down circuit configured to selectively activate at least one of discharging paths between the second power rail and the input/output pad in response to the pull-down control signal, wherein the pull-down circuit includes a second resistor and NMOS transistors arranged on the discharging paths, and the second resistor is coupled between the second power rail and the NMOS transistors.

Another aspect of the present disclosure is a method for manufacturing an off chip driver circuit. The method for manufacturing the off chip driver circuit includes: forming a first resistor and PMOS transistors on a substrate; forming a second resistor and NMOS transistors on the substrate; and forming a first power rail connected to the first resistor, a second power rail connected to the second resistor, and an input/output pad connected to the PMOS transistors and the NMOS transistors.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
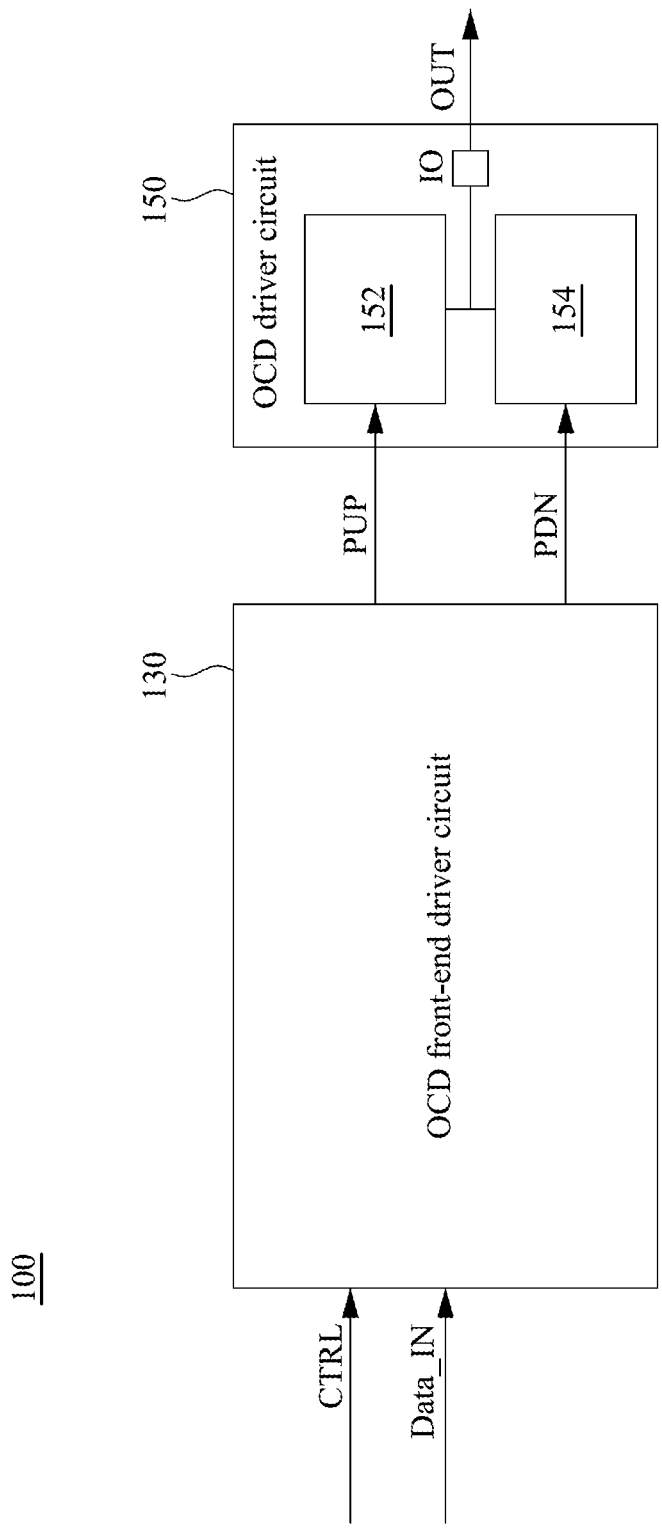
FIG. 1 is a schematic diagram illustrating an off chip driver system in accordance with some embodiments of the present disclosure.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

In this document, the term "coupled" may also be termed "electrically coupled," and the term "connected" may be termed "electrically connected." "Coupled" and "connected" may also be used to indicate that two or more elements cooperate or interact with each other. In the following description and in the claims, the terms "include" and "comprise" are used in an open-ended fashion, and thus should be interpreted to mean "include, but not limited to." As used herein, the term "and/or" includes any and all combinations of one or more of the associated listed items.

As semiconductor manufacturers persistently scale down feature size and drive silicon technology into better electrical and economic performance, clock speed and transmission speed often double between one generation and another, and signal integrity become a serious concern when the transition (rise and fall) times of signals become faster in many applications. In the design of memory chips, such as dynamic RAM (DRAM) and synchronous DRAM (SDRAM), off chip drivers (OCDs) are introduced to improve signal integrity when transmitting an output signal to an outside environment, such as a memory controller. Typically, the OCD generally comprises several transistors, including N-channel (NMOS) MOSFET transistors and P-channel (PMOS) MOSFET transistors configured to produce output signal (e.g., DQS and/DQS signals) via an input/output pad to the memory controller.

Correspondingly, the OCDs need to meet the requirements for high speed data transmission to maintain signal integrity. In some embodiments, the OCDs usually can produce the data signal (e.g., DQS and/DQS signals) via an input/output pad to drive an outside device (e.g., the memory controller). And, under different conditions such as a process, a voltage, and a temperature (PVT), the loads of the outside device may be different. Accordingly, the OCDs can be calibrated based on these conditions such as the process, the voltage, and the temperature (PVT) before providing the data signals to the outside device in order to maintain the signal integrity.

However, with the advancement of the memory product from DDR4 to DDR5, the operation speed of the memory device increases. In some embodiments, the OCD includes a pull-up circuit and a pull-down circuit for setting output voltage levels on the data signal produced by the OCD. Each of the pull-up circuit and the pull-down circuit include active components (e.g., transistors, amplifiers or diodes) and passive components (e.g., resistors or capacitors). The active components and the passive components in the pull-up circuit and the pull-down circuit induce internal loading effects within the OCD. In high speed data transmission, when the internal loading effects are heavy, the data signal produced by the OCD is tend to be attenuated and distorted. This phenomenon becomes severe when the operation frequency increases. For example, a slew rate of pulling high/low the output signal provided by the OCD is affected by a total loading and a driving capacity of the OCD. The total loading includes an external loading and an internal loading. The OCD provides an output signal through an input/output pad (I/O pad) to drive some external components connected with the I/O pad. The external loading is determined according to the external components connected with the I/O pad. The internal loading is determined according to internal components (e.g., transistors, resistors) and connection wirings within the OCD. The driving capacity of the OCD is determined according to parameters of the internal components (e.g., dimensions of the transistors) in the OCD. If the slew rate of pull-up/pull-down circuit is not enough, or if a slew rate of the pull-up circuit and another slew rate of the pull-down circuit are mismatched, or if the external or internal loading effect is too large, the output signal generated by the OCD will be distorted. To solve this problem, the disclosure provides some embodiments which adopt different structures for the OCDs (for example, changing the placement between active components and passive components to reduce the internal loading effect so as to prevent the data signal from distorted in high speed data transmission, and then maintain overall signal integrity when the semiconductor memory device process the data signal).

Reference is made to FIG. 1. FIG. 1 is a schematic diagram illustrating an off chip driver system 100 in accordance with some embodiments of the present disclosure. For example, when a data signal Data_IN is logic high and input to a front-end driver circuit 130, the front-end driver circuit 130 is configured to control an OCD driver circuit 150 to provide a high voltage to an input/output pad IO so as to output the output signal OUT with logic high. When the data signal Data_IN is logic low and input to the front-end driver circuit 130, the front-end driver circuit 130 is configured to control the OCD driver circuit 150 to provides a low voltage to the input/output pad IO so as to output the output signal OUT with logic low.

In some embodiments, a control signal CTRL is input to the front-end driver circuit 130 in order to control parameters of the OCD driver circuit 150 (e.g., a current value or a voltage level of the output signal generated by the OCD driver circuit 150, or a resistance of the OCD driver circuit 150 for impedance matching) according to some process, voltage, and temperature conditions (i.e., PVT conditions).

FIG. 1 is a schematic diagram illustrating the off chip driver system 100 in accordance with some embodiments of the present disclosure. In some embodiments, as illustrated in FIG. 1, the off chip driver system 100 includes the front-end driver circuit 130 and the OCD driver circuit 150. The OCD driver circuit 150 includes a pull-up circuit 152 and a pull-down circuit 154 and the input/output pad IO. In configurationally, the front-end driver circuit 130 is configured to receive the control signals CTRL and the data signal Data_IN, and configured to output pull-up control signals PUP and pull-down control signals PDN to the OCD driver circuit 150. In some embodiments, the control signals CTRL received by the front-end driver circuit 130 includes multiple control signals CTRL for different functions, such as a control signal OCD_CTRL for controlling the OCD function, another control signal ODT_CTRL for controlling a On Die Termination (ODT) function and/or another control signal ZQ-Cali for calibrating an output signal of the OCD driver circuit 150. The front-end driver circuit 130 is configured to control the OCD driver circuit 150 according to these received control signals CTRL. The OCD driver circuit 150 is configured to receive the pull-up control signals PUP and the pull-down control signals PDN in order to provide the output signal OUT through the input/output pad IO.

For example, when the data signal Data_IN is at logic high, the front-end driver circuit 130 generates the pull-up control signals PUP to trigger the pull-up circuit 152, and the pull-up circuit 152 is configured to generate the high voltage (i.e., pulling the output signal OUT to the high level, such as VDD) to the input/output pad IO in response to the pull-up control signals PUP. On the other hand, when the data signal Data_IN is at logic low, the front-end driver circuit 130 generates the pull-down control signals PDN to trigger the pull-down circuit 154, the pull-down circuit 154 is configured to generate the low voltage (i.e., pulling the output signal OUT to the low level, such as VSS) to the input/output pad IO in response to the pull-down control signal PDN. The operation of the OCD driver circuit 150 will be discussed below with the reference to FIGS. 2A and 2B.

Figure 2B:
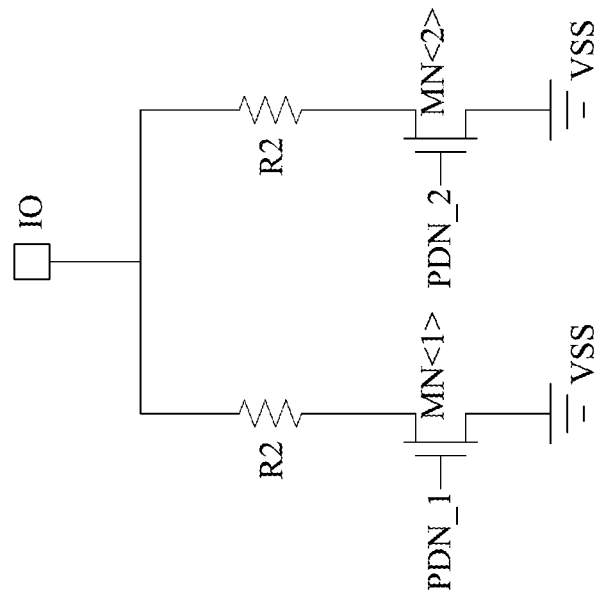
FIG. 2B is a schematic diagram illustrating a pull-down circuit in some general cases.
Figure 2A:
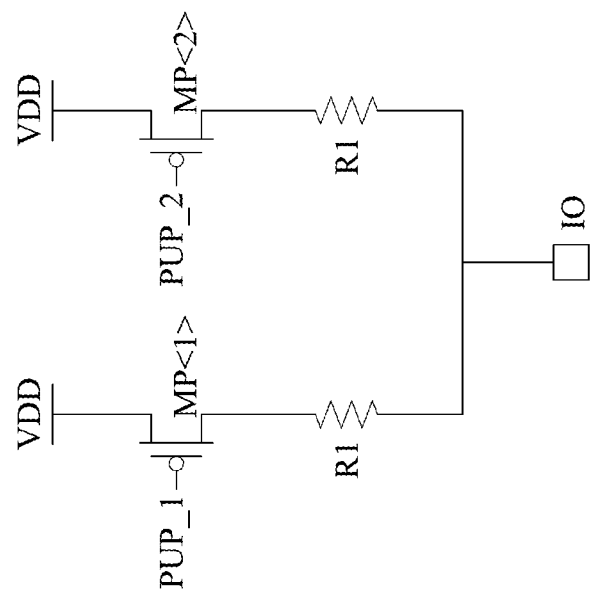
FIG. 2A is a schematic diagram illustrating a pull-up circuit in some general cases.

Please refer to FIG. 2A. FIG. 2A is a schematic diagram illustrating a pull-up circuit in some general cases. In some general cases, as illustrated in FIG. 2A, the pull-up circuit includes a PMOS transistor MP<1>, a PMOS transistor MP<2>, and resistors R1. The PMOS transistor MP<1> and the resistor R1 are connected in series between a power rail VDD and the input/output pad IO. The PMOS transistor MP<2> and the resistor R1 is connected in series between the power rail VDD and the input/output pad IO. A gate terminal of the PMOS transistor MP<1> is configured to receive a pull-up control signal PUP_1 and a gate terminal of the PMOS transistor MP<2> is configured to receive a pull-up control signal PUP_2. In some general cases, the pull-up control signals PUP illustrated in FIG. 1 includes the pull-up control signals PUP_1 and PUP_1 illustrated in FIG. 2A.

In configurationally, when the data signal Data_IN is logic high, at least one of the PMOS transistor MP<1> and the PMOS transistor MP<2> are configured to be conducted according to the pull-up control signal PUP_1 and the pull-up control signal PUP_2 in order to transmit the high voltage (i.e., the power rail VDD) to the input/output pad IO. The PMOS transistor MP<1> and the PMOS transistor MP<2> form two different charging paths between the input/output pad IO and the power rail VDD. For example, the PMOS transistor MP<1> and the PMOS transistor MP<2> can be implemented with different dimensions, and the PMOS transistor MP<1> can allow a passing current larger than the PMOS transistor MP<2>. When it is required to decrease a pull-up slew rate of the OCD driver circuit 150, only the PMOS transistor MP<2> can be conducted by the pull-up control signal PUP_2 while pulling up the input/output pad IO. When it is required to increase the pull-up slew rate of the OCD driver circuit 150, only the PMOS transistor MP<1> can be conducted by the pull-up control signal PUP_1 while pulling up the input/output pad IO. When it is required to maximize the pull-up slew rate of the OCD driver circuit 150, both the PMOS transistor MP<1> and the PMOS transistor MP<2> can be conducted by the pull-up control signals PUP_1 and PUP_2 while pulling up the input/output pad IO. In some general cases, the pull-up control signals PUP_1 and PUP_2 are determined according to the control signal CTRL corresponding to the PVT conditions of the off chip driver system 100. Accordingly, the pull-up circuit as illustrating in FIG. 2A is configured to, according to the pull-up control signal PUP, selectively activate at least one of charging paths between the power rail VDD and the input/output pad IO so as to provide the high voltage to the input/output pad IO.

Please refer to FIG. 2B. FIG. 2B is a schematic diagram illustrating a pull-down circuit in some general cases. In some general cases, as illustrated in FIG. 2B, the pull-down circuit includes a NMOS transistor MN<1>, a NMOS transistor MN<2>, and resistors R2. In some general cases, the pull-down control signals PDN illustrated in FIG. 1 includes the pull-down control signals PDN_1 and PDN_2 illustrated in FIG. 2B.

In configurationally, when the data signal Data_IN is logic low, the NMOS transistor MN<1> and the NMOS transistor MN<2> are configured to be conducted according to the pull-down control signal PDN_1 and the pull-down control signal PDN_2 in order to transmit the low voltage (i.e., the power rail VSS) to the input/output pad IO. In some embodiments, the pull-down control signal PDN_1 and the pull-down control signal PDN_2 are determined as PVT conditions change. Accordingly, the pull-down circuit as illustrating in FIG. 2B is configured to, according to the pull-down control signal PDN, selectively activate at least one of discharging paths between the power rail VSS and the input/output pad IO so as to provide the low voltage to the input/output pad IO.

As shown in FIG. 2A, when the input/output pad IO is to be charged, the charging paths relative to the input/output pad IO is started from the input/output pad IO, the passive resistive load (e.g., the resistors R1) through the active component MOSFET (e.g., the PMOS transistor MP<1> and/or MP<2>) and then to the power rail VDD. As shown in FIG. 2B, when the input/output pad IO is to be discharged, the discharging paths relative to the input/output pad IO is started from the input/output pad IO, the passive resistive load (e.g., the resistors R2) through the active component MOSFET (e.g., the PMOS transistor MN<1> and/or MN<2>) and then to the power rail VSS.

In these OCD structures as illustrated in FIGS. 2A and 2B, the passive resistive loads (e.g., the resistors R1 and R2) are directly coupled with the input/output pad IO. The total loading includes the external loading (induced by the external components connected with the input/output pad IO) and the internal loading (induced by the internal components within the OCD driver circuit 150). As shown in FIG. 2A and FIG. 2B, the total loading includes capacitance between gate and drain of active component MOSFET (Cgd of MP<1> and MP<2> or MN<1> and/or MN<2>), resistances of the passive resistive loads (e.g., the resistors R1 and R2) and the external loading (not shown in figures). In this case, it will induce a large loading effect on the input/output pad IO. While pulling up or pulling down the voltage level on the input/output pad IO, it is required to overcome the loading effect induced by these passive resistive loads (e.g., the resistors R1 and R2) and an external load coupled with the input/output pad IO. The too large loading effect will cause signals distorted and attenuated in high speed data transmission as the operation frequency becomes faster and faster.

Figure 3C:
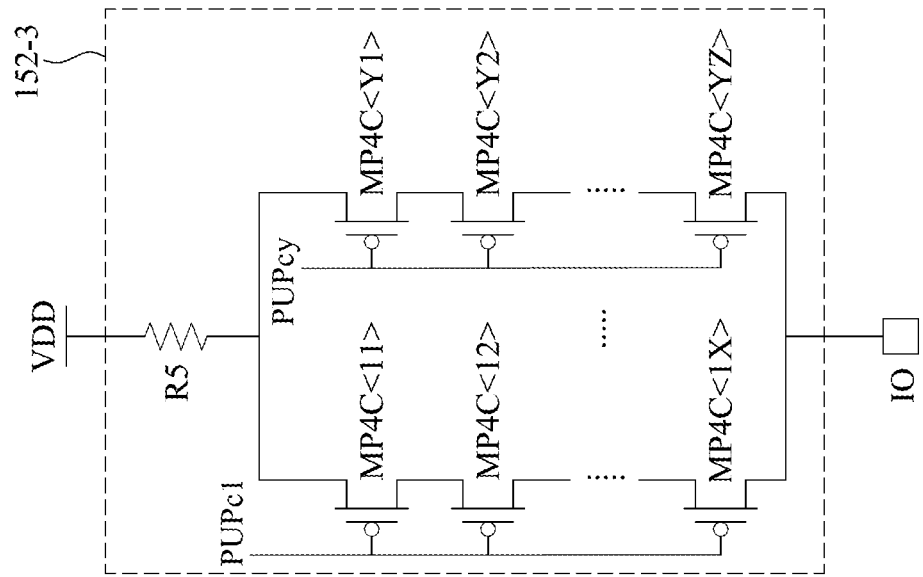
FIGS. 3A-3C are schematic diagrams illustrating pull-up units in accordance with some embodiments of the present disclosure.
Figure 3B:
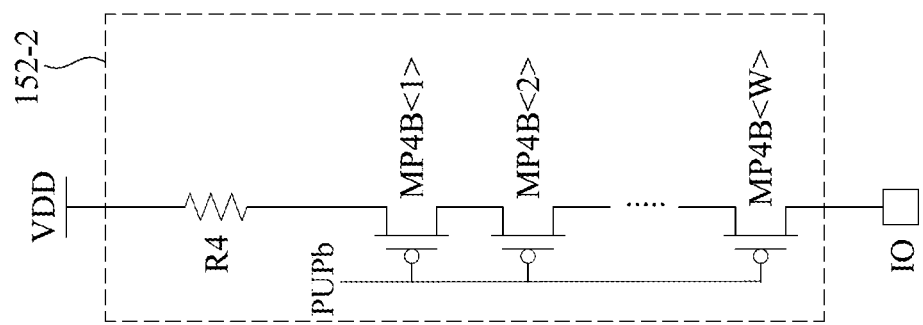
Figure 3A:
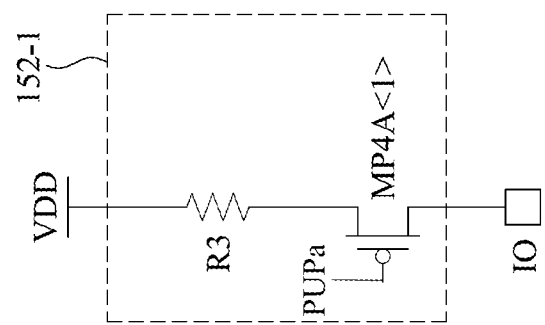

Some embodiments of the present disclosure may reduce the loading effect by altering the placement of resistors. Please refer to FIG. 3A to FIG. 3C. FIG. 3A to FIG. 3C are schematic diagrams illustrating pull-up units 152-1 to 152-3 in accordance with some embodiments of the present disclosure. The pull-up circuit 152 can be implemented by the pull-up unit 152-1, the pull-up unit 152-2, the pull-up unit 152-3, or any combination of the pull-up units 152-1, 152-2 and/or 152-3. The pull-up unit 152-1 includes a PMOS transistor MP4A<1> and a resistor R3. The PMOS transistor MP4A<1> is controlled by a gate signal PUPa. The pull-up unit 152-2 includes PMOS transistors MP4B<1> to MP4B<W> connected in series and a resistor R4, in which W is a positive integer. The PMOS transistor MP4B<1> to MP4B<W> can be controlled by a gate signal PUPb. The pull-up unit 152-3 includes PMOS transistors MP4C<11> to MP4C<YZ> and a resistor R5, in which X, Y and Z is positive integers. As shown in FIG. 3C, the PMOS transistor MP4C<11> to MP4C<1X> can be controlled by a gate signal PUPc1. As shown in FIG. 3C, the PMOS transistor MP4C<Y1> to MP4C<YZ> can be controlled by another gate signal PUPcy. Specifically, the pull-up unit 152-3 may include several series-connected PMOS transistors connected in parallel and each series-connected PMOS transistors may have a different number of the PMOS transistors connected between the input/output pad IO and the resistor R5.

Figure 4A:
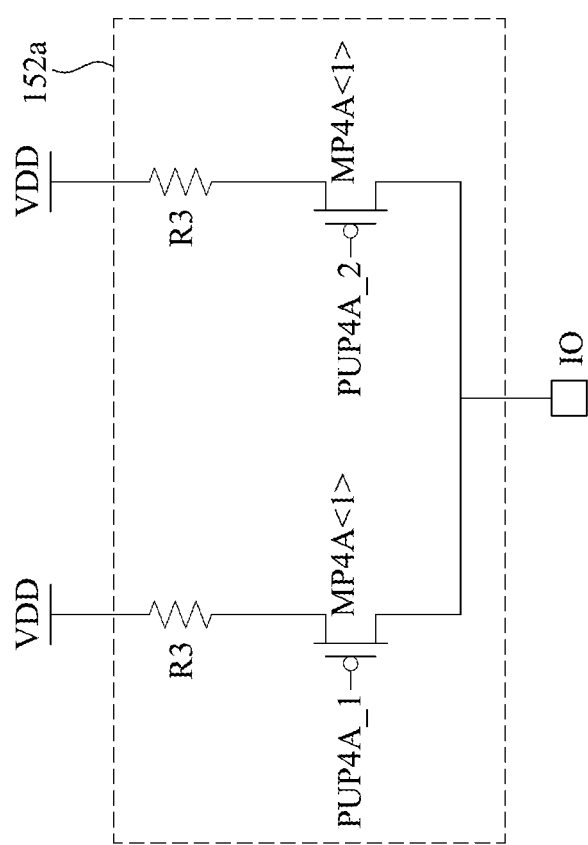
FIGS. 4A-4D are schematic diagrams illustrating pull-up circuits in accordance with some embodiments of the present disclosure.

Please refer to FIG. 4A. FIG. 4A is a schematic diagram illustrating a pull-up circuit 152a in accordance with some embodiments of the present disclosure. In some embodiments, as shown in FIG. 4A, the pull-up circuit 152a can be utilized as the pull-up circuit 152 shown in FIG. 1, and the pull-up circuit 152a may be implemented by two pull-up units 152-1 illustrated in FIG. 4A, both of which are connected between the power rail VDD and the input/output pad IO. A gate terminal of the PMOS transistor MP4A<1> on the left is configured to receive a pull-up control signal PUP4A_1. A gate terminal of the PMOS transistor MP4A<1> on the right is configured to receive a pull-up control signal PUP4A_2. The pull-up control signals PUP illustrated in FIG. 1 includes the pull-up control signals PUP4A_1 and PUP4A_2 in FIG. 4A. It is noticed that parameters of these two PMOS transistors MP4A<1> on two charging paths are not necessarily equal, these two PMOS transistors MP4A<1> can be formed in different parameters according to practical applications. Similarly, two resistors R3 on two charging paths are not necessarily equal.

In configurationally, when the data signal Data_IN is logic high, at least one of the PMOS transistors MP4A<1> are configured to be conducted according to the pull-up control signal PUP4A_1 or the pull-up control signal PUP4A_2 in order to transmit the high voltage (i.e., the power rail VDD) to the input/output pad IO. Accordingly, the pull-up circuit as illustrating in FIG. 4A is configured to, according to the pull-up control signal PUP, selectively activate at least one of charging paths between the power rail VDD and the input/output pad IO so as to provide the high voltage to the input/output pad IO. For the ease of understanding, the operation of the pull-up circuit 152a in FIG. 4A is similar the pull-up circuit illustrated in FIG. 2A, thus the explanation is omitted. It is noticed that the charging path of the input/output pad IO as shown in FIG. 4A is from the input/output pad IO through the PMOS transistors MP4A<1>, then the resistors R3 to the power rail VDD. The charging path of the input/output pad IO as shown in FIG. 4A is different the general case shown in FIG. 2A, in which the charging path is from the input/output pad IO through the resistors R1, then the PMOS transistors to the power rail VDD as shown in FIG. 2A.

It is noticed that, the resistors R3 in the pull-up circuit 152a in FIG. 4A are not directly coupled to the input/output pad IO. One resistor R3 on the left is coupled between the power rail VDD and the PMOS transistor MP4A<1>. Another resistor R3 on the right is coupled between the power rail VDD and the PMOS transistor MP4A<1>. If the PMOS transistors MP4A<1> are turned off, the resistors R3 are disconnected from the input/output pad IO (blocking by the PMOS transistors MP4A<1>), such that the loading effect on the input/output pad IO can be reduced. For example, when the input/output pad IO is currently pulled down by the pull-down circuit 154, the PMOS transistors MP4A<1> in the pull-up circuit 152a are turned off, such that the resistors R3 are disconnected from the input/output pad IO and the resistors R3 will not induce the loading effect on the input/output pad IO.

Figure 4B:
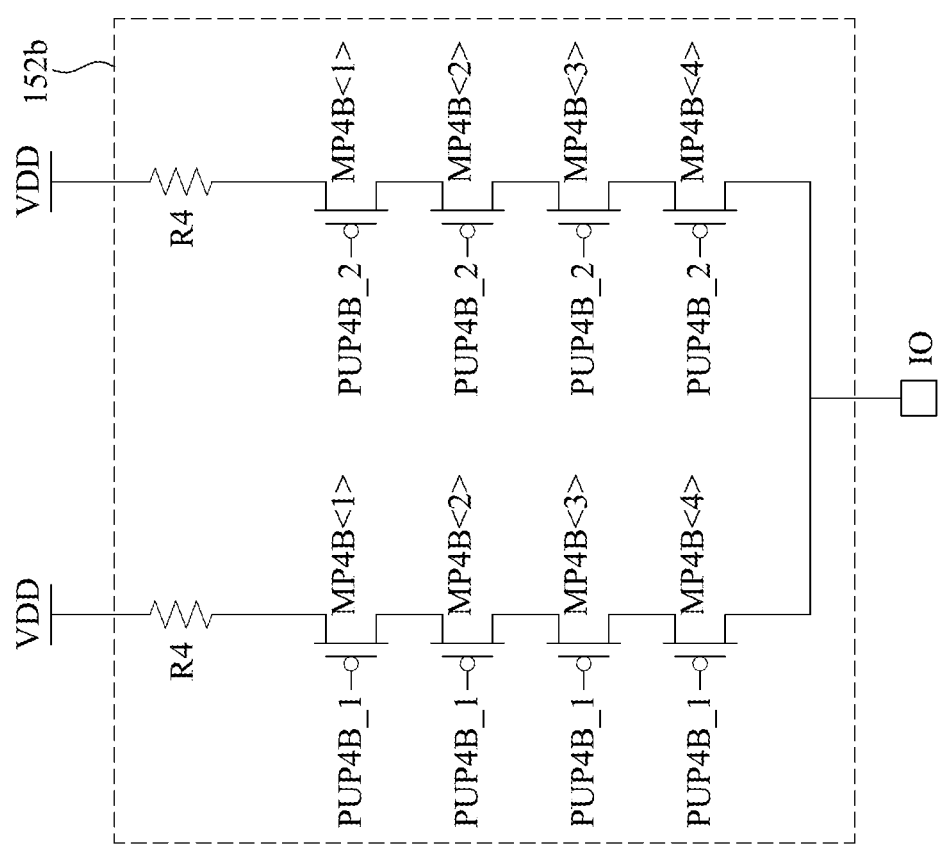

Please refer to FIG. 4B. FIG. 4B is a schematic diagram illustrating a pull-up circuit 152b in accordance with some embodiments of the present disclosure. In some embodiments, as shown in FIG. 4B, the pull-up circuit 152b can be utilized as the pull-up circuit 152 shown in FIG. 1, and the pull-up circuit 152b may be implemented by two pull-up units 152-2 illustrated in FIG. 3B, both of which are connected between the power rail VDD and the input/output pad IO. The PMOS transistors MP4B<1>-MP4B<4> on the left is connected in series and each of gate terminals of the PMOS transistors MP4B<1>-MP4B<4> on the left is configured to receive a pull-up control signal PUP4B_1. The PMOS transistors MP4B<1>-MP4B<4> on the right are connected in series and each of gate terminals of the PMOS transistors MP4B<1>-MP4B<4> on the right is configured to receive a pull-up control signal PUP4B_2. It is noticed that parameters of these PMOS transistors MP4B<1> to MP4B<4> on two charging paths are not necessarily equal, these PMOS transistors MP4B<1> to MP4B<4> on two charging paths can be formed in different parameters according to practical applications. Similarly, two resistors R4 on two charging paths are not necessarily equal. In some embodiments, the pull-up control signals PUP illustrated in FIG. 1 includes the pull-up control signals PUP4B_1 and PUP4B_2 in FIG. 4B.

In configurationally, when the data signal Data_IN is logic high, at least one string of the PMOS transistors MP4B<1>-MP4B<4> are configured to be conducted according to the pull-up control signal PUP4B_1 or the pull-up control signal PUP4B_2 in order to transmit the high voltage (i.e., the power rail VDD) to the input/output pad IO. Accordingly, the pull-up circuit as illustrating in FIG. 4B is configured to, according to the pull-up control signal PUP, selectively activate at least one of charging paths between the power rail VDD and the input/output pad IO so as to provide the high voltage to the input/output pad IO. For the ease of understanding, the operation of the pull-up circuit 152b in FIG. 4B is similar the pull-up circuit illustrated in FIG. 4A, thus the explanation is omitted.

It is noticed that, the resistors R4 in the pull-up circuit 152b in FIG. 4B are not directly coupled to the input/output pad IO. If the PMOS transistors MP4B<1>-MP4B<4> are turned off, the resistors R4 are disconnected from the input/output pad IO (blocking by the PMOS transistors MP4B<1>-MP4B<4>), such that the loading effect on the input/output pad IO can be reduced. For example, when the input/output pad IO is currently pulled down by the pull-down circuit 154, the PMOS transistors MP4B<1>-MP4B<4> in the pull-up circuit 152b are turned off, such that the resistors R4 are disconnected from the input/output pad IO and the resistors R4 will not induce the loading effect on the input/output pad IO.

Figure 4C:
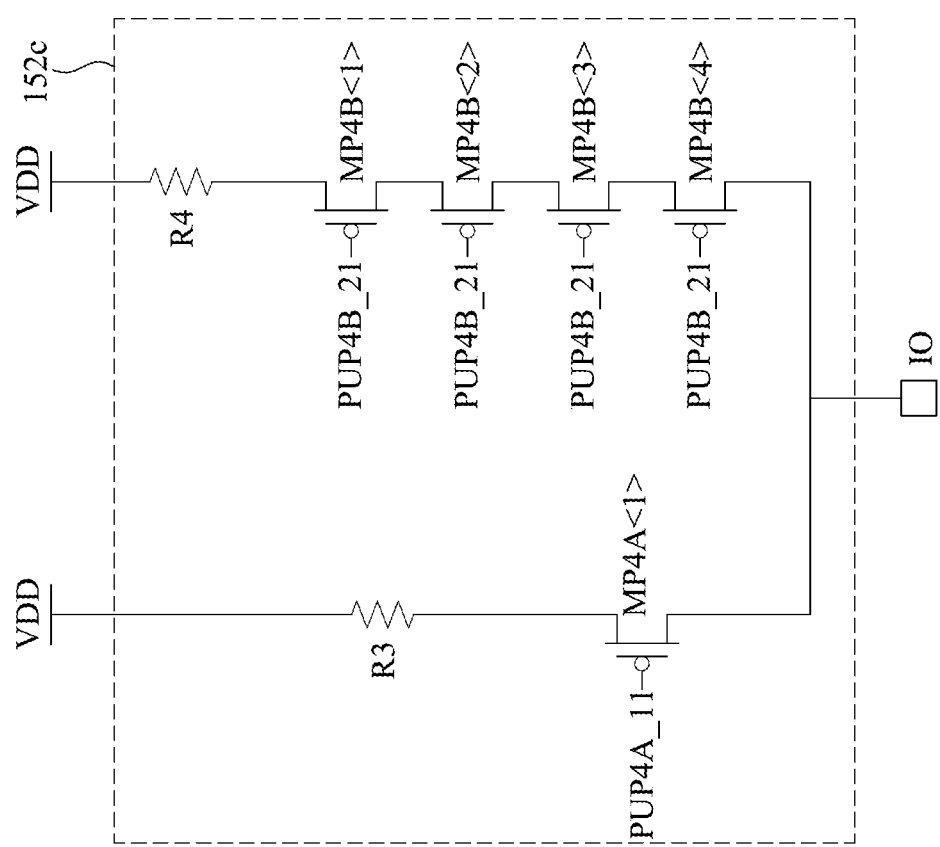

Please refer to FIG. 4C. FIG. 4C is a schematic diagram illustrating a pull-up circuit 152c in accordance with some embodiments of the present disclosure. In some embodiments, as shown in FIG. 4C, the pull-up circuit 152c can be utilized as the pull-up circuit 152 shown in FIG. 1, and the pull-up circuit 152c may be implemented by the pull-up unit 152-1 illustrated in FIG. 3A and the pull-up units 152-2 illustrated in FIG. 3B, both of which are connected between the power rail VDD and the input/output pad IO. Similarly, the PMOS transistors MP4A<1> are connected between the resistor R3 and the input/output pad IO, and the PMOS transistors MP4A<1> is configured to receive a pull-up control signal PUP4A_11. The PMOS transistors MP4B<1>-MP4B<4> are connected in series and each of gate terminals of the PMOS transistors MP4B<1>-MP4B<4> is configured to receive a pull-up control signal PUP4B_21. In some embodiments, the pull-up control signals PUP illustrated in FIG. 1 includes the pull-up control signals PUP4A_11 and PUP4B_21. For the ease of understanding, the operation of the pull-up circuit 152c is similar the pull-up circuit illustrated in FIG. 4A, thus the explanation is omitted.

It is noticed that, the resistors R3 and R4 in the pull-up circuit 152c in FIG. 4C are not directly coupled to the input/output pad IO. If the PMOS transistors MP4A<1>, MP4B<1>-MP4B<4> are turned off, the resistors R3 and R4 are disconnected from the input/output pad IO, such that the loading effect on the input/output pad IO can be reduced. For example, when the input/output pad IO is currently pulled down by the pull-down circuit 154, the PMOS transistors MP4A<1>, MP4B<1>-MP4B<4> in the pull-up circuit 152c are turned off, such that the resistors R3 and R4 are disconnected from the input/output pad IO and the resistors R3 and R4 will not induce the loading effect on the input/output pad IO.

Figure 4D:
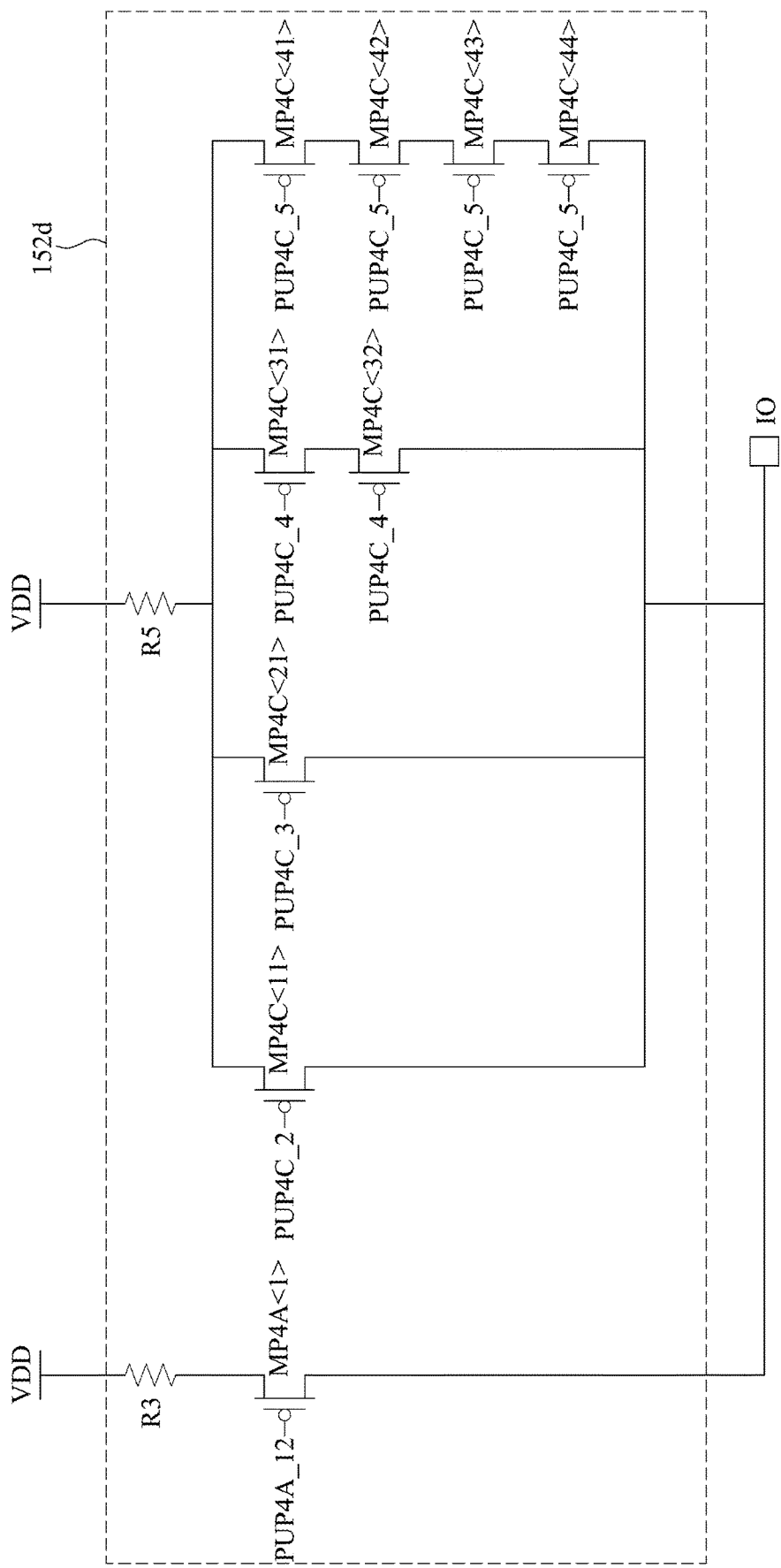

Please refer to FIG. 4D. FIG. 4D is a schematic diagram illustrating a pull-up circuit 152d in accordance with some embodiments of the present disclosure. In some embodiments, as shown in FIG. 4D, the pull-up circuit 152d can be utilized as the pull-up circuit 152 shown in FIG. 1, and the pull-up circuit 152d may be implemented by the pull-up unit 152-1 illustrated in FIG. 3A and the pull-up units 152-3 illustrated in FIG. 3C. Similarly, the PMOS transistors MP4A<1> are connected between the resistor R3 and the input/output pad IO, and a gate terminal of the PMOS transistors MP4A<1> is configured to receive a pull-up control signal PUP4A_12. The pull-up circuit 152d in FIG. 4D includes the PMOS transistor MP4C<11>, the PMOS transistor MP4C<21>, the PMOS transistors MP4C<31>-MP4C<32> connected in series, the PMOS transistors MP4C<41>-MP4C<44> connected in series. A gate terminal of the PMOS transistor MP4C<11> is configured to receive a pull-up control signal PUP4C_2. A gate terminal of the PMOS transistor MP4C<21> is configured to receive a pull-up control signal PUP4C_3. Each of gate terminals of the PMOS transistors MP4C<31>-MP4C<32> is configured to receive a pull-up control signals PUP4C_4. Each of gate terminals of the PMOS transistors MP4C<41>-MP4C<44> is configured to receive a pull-up control signal PUP4C_5. In some embodiments, the pull-up control signals PUP illustrated in FIG. 1 includes the pull-up control signals PUP4A_12, PUP4C_2, PUP4C_3, PUP4C_4, and PUP4C_5. For the ease of understanding, the operation of the pull-up circuit 152d is similar the pull-up circuit illustrated in FIG. 4A, thus the explanation is omitted.

It is noticed that, the resistors R3 and R5 in the pull-up circuit 152d in FIG. 4D are not directly coupled to the input/output pad IO. If the PMOS transistors in the pull-up circuit 152d shown in FIG. 4D are turned off, the resistors R3 and R5 are disconnected from the input/output pad IO, such that the loading effect on the input/output pad IO can be reduced. For example, when the input/output pad IO is currently pulled down by the pull-down circuit 154, the PMOS transistors in the pull-up circuit 152d are turned off, such that the resistors R3 and R5 are disconnected from the input/output pad IO and the resistors R3 and R5 will not induce the loading effect on the input/output pad IO.

It should be noted that the pull-up circuits 152a-152d are merely examples, and not intended to limit the present disclosure. Any circuit that implements the pull-up circuit, in which the resistor is coupled between the power rail VDD and the active component MOSFET, is within the scope of the present disclosure. That is, the design of the pull-up circuit 152 may be adjusted by those of ordinary skills in the art.

Figure 5C:
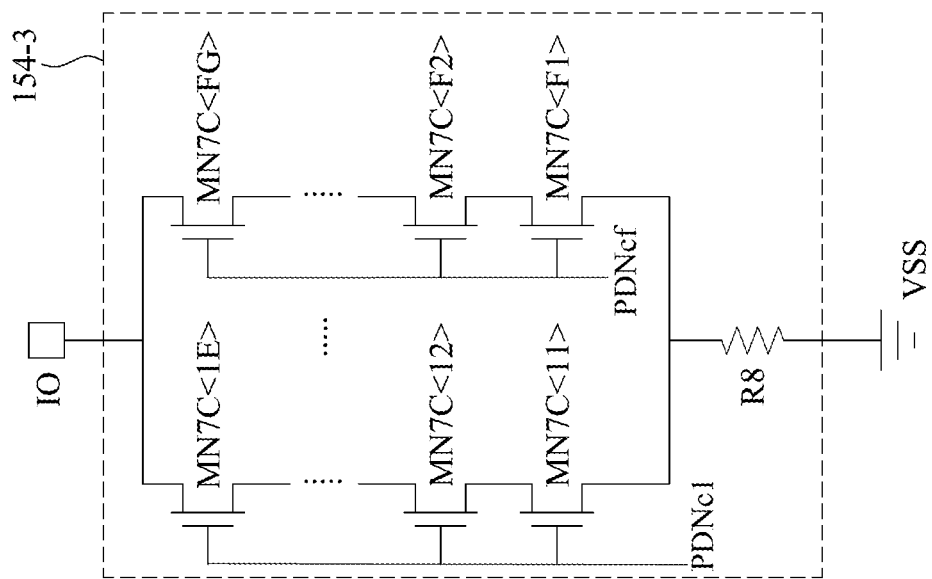
FIGS. 5A-5C are schematic diagrams illustrating pull-down units in accordance with some embodiments of the present disclosure.
Figure 5B:
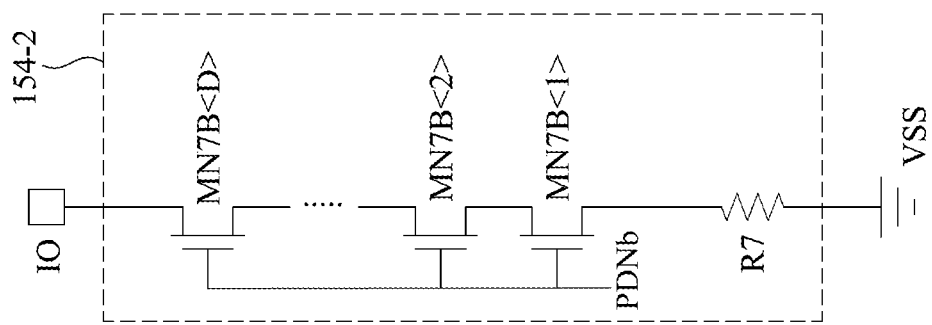
Figure 5A:
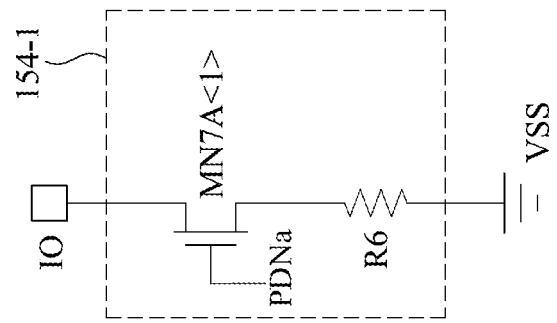

Please refer to FIGS. 5A-5C. FIGS. 5A-5C are schematic diagrams illustrating pull-down units 154-1 to 154-3 in accordance with some embodiments of the present disclosure. The pull-down circuit 154 shown in FIG. 1 can be implemented by the pull-down unit 154-1 in FIG. 5A, the pull-down unit 154-2 in FIG. 5B, the pull-down unit 154-3 in FIG. 5C, or any combination of the pull-down unit 154-1-154-3. The pull-up unit 154-1 includes a NMOS transistor MN7A<1> and a resistor R6. The PMOS transistor MN7A<1> is controlled by a gate signal PDNa. The pull-down unit 154-2 includes NMOS transistors MN7B<1> to MN7B<D> connected in series and a resistor R7, in which D is a positive integer. The PMOS transistor MN7B<1> to MN7B<D> can be controlled by a gate signal PDNb. The pull-down unit 154-3 includes NMOS transistors MN7C<11> to MN7C<FG> and a resistor R8, in which E, F and G is positive integers. The PMOS transistor MN7C<11> to MN7B<1E> can be controlled by a gate signal PDNc1. The PMOS transistor MN7C<F1> to MN7B<FG> can be controlled by a gate signal PDNcf. Specifically, the pull-down unit 154-3 may include several series-connected NMOS transistors connected in parallel and each series-connected NMOS transistors may have a different number of the NMOS transistors connected between the input/output pad IO and the resistor R5.

Figure 6A:
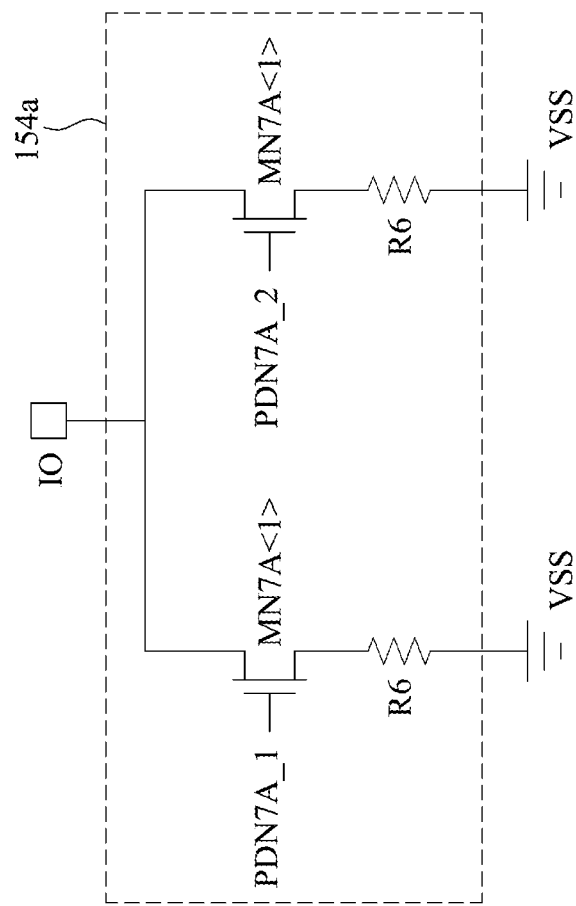
FIGS. 6A-6D are schematic diagrams illustrating pull-down circuits in accordance with some embodiments of the present disclosure.

Please refer to FIG. 6A. FIG. 6A is a schematic diagram illustrating a pull-down circuit 154a in accordance with some embodiments of the present disclosure. In some embodiments, as shown in FIG. 6A, the pull-down circuit 154a can be utilized as the pull-down circuit 154 shown in FIG. 1, and the pull-down circuit 154a may be implemented by two pull-down units 154-1 illustrated in FIG. 5A, both of which are connected between the power rail VSS and the input/output pad IO. In configurationally, when the data signal Data_IN is logic low, at least one of the NMOS transistors MN7A<1> are configured to be conducted according to the pull-down control signal PDN7A_1 or the pull-down control signal PDN7A_2 in order to transmit the low voltage (i.e., the power rail VSS) to the input/output pad IO. It is noticed that parameters of these NMOS transistors MN7A<1> to MN7A<2> on two charging paths are not necessarily equal, these NMOS transistors MN7A<1> to MN7A<2> on two charging paths can be formed in different parameters according to practical applications. Similarly, two resistors R6 on two charging paths are not necessarily equal. Accordingly, the pull-down circuit 154a as illustrating in FIG. 6A is configured to, according to the pull-down control signals PDN7A_1 and PDN7A_2, selectively activate at least one of discharging paths between the power rail VSS and the input/output pad IO so as to provide the low voltage to the input/output pad IO. The operation of the pull-down circuit 154a in FIG. 6A is similar the pull-down circuit illustrated in FIG. 2B. It is noticed that the discharging path of the input/output pad IO as shown in FIG. 6A is from the input/output pad IO through the NMOS transistors MP7A<1>, then the resistors R6 to the power rail VSS. The discharging path of the input/output pad IO as shown in FIG. 6A is different the general case shown in FIG. 2B, in which the discharging path is from the input/output pad IO through the resistors R2, then the NMOS transistors to the power rail VSS as shown in FIG. 2B.

It is noticed that, the resistors R6 in the pull-down circuit 154a in FIG. 6A are not directly coupled to the input/output pad IO. One resistor R6 on the left is coupled between the power rail VSS and the NMOS transistor MN7A<1>. Another resistor R6 on the right is coupled between the power rail VSS and the NMOS transistor MN7A<1>. If the NMOS transistors MN7A<1> are turned off, the resistors R6 are disconnected from the input/output pad IO (blocking by the NMOS transistors MN7A<1>), such that the loading effect on the input/output pad IO can be reduced. For example, when the input/output pad IO is currently pulled up by the pull-up circuit 152, the NMOS transistors MN7A<1> in the pull-down circuit 154a are turned off, such that the resistors R6 are disconnected from the input/output pad IO and the resistors R6 will not induce the loading effect on the input/output pad IO.

Figure 6B:
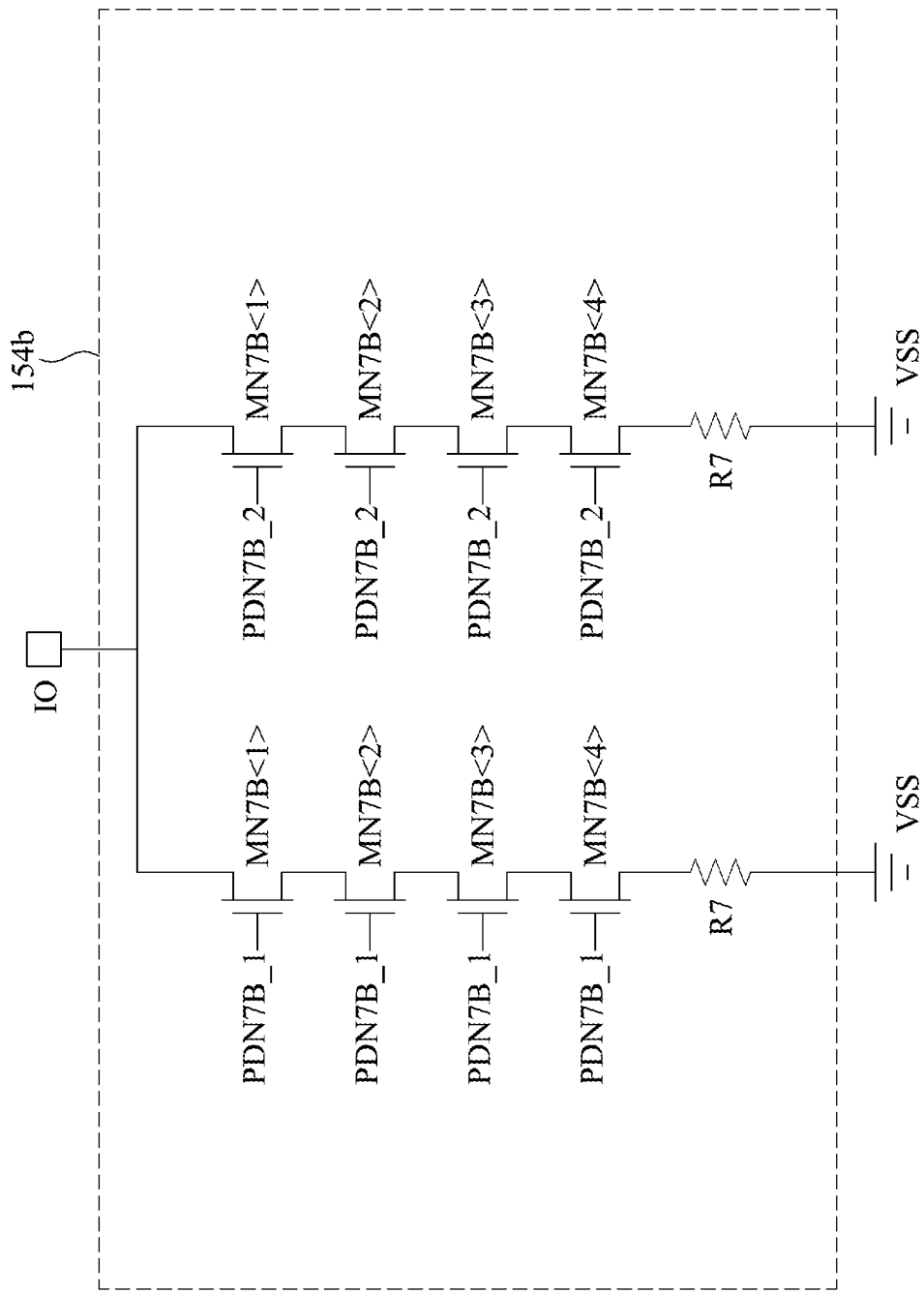

Please refer to FIG. 6B. FIG. 6B is a schematic diagram illustrating a pull-down circuit 154b in accordance with some embodiments of the present disclosure. In some embodiment, as shown in FIG. 6B, the pull-down circuit 154 can be utilized as the pull-down circuit 154 shown in FIG. 1, and the pull-down circuit 154b may be implemented by two pull-down units 154-2 illustrated in FIG. 5B both of which are connected between the power rail VSS and the input/output pad IO. In FIG. 6B, when the pull-down circuit 154b is activated, a current flows from top (i.e., the input/output pad IO) to bottom (i.e., the power rail VSS). In some embodiments, the pull-down control signals PDN illustrated in FIG. 1 includes the pull-down control signals PDN7B_1 and PDN7B_2 shown in FIG. 6B. In configurationally, when the data signal Data_IN is logic low, at least one string of the two strings formed by the NMOS transistors MN7B<1>-MN7B<4> are configured to be conducted according to the pull-down control signal PDN7B_1 or the pull-down control signal PDN7B_2 in order to transmit the low voltage (i.e., the power rail VSS) to the input/output pad IO. Accordingly, the pull-down circuit 154b as illustrating in FIG. 6B is configured to, according to the pull-down control signals PDN7B_1 and PDN7B_2, selectively activate at least one of discharging paths between the power rail VSS and the input/output pad IO so as to provide the low voltage to the input/output pad IO. For the ease of understanding, the operation of the pull-down circuit 154b is similar the pull-down circuit 154a illustrated in FIG. 6A, thus further explanation is omitted.

It is noticed that, the resistors R7 in the pull-down circuit 154b in FIG. 6B are not directly coupled to the input/output pad IO. If the NMOS transistors MN7B<1>-MNB7<4> are turned off, the resistors R7 are disconnected from the input/output pad IO (blocking by the NMOS transistors MN7B<1>-MNB7<4>), such that the loading effect on the input/output pad IO can be reduced.

Figure 6C:
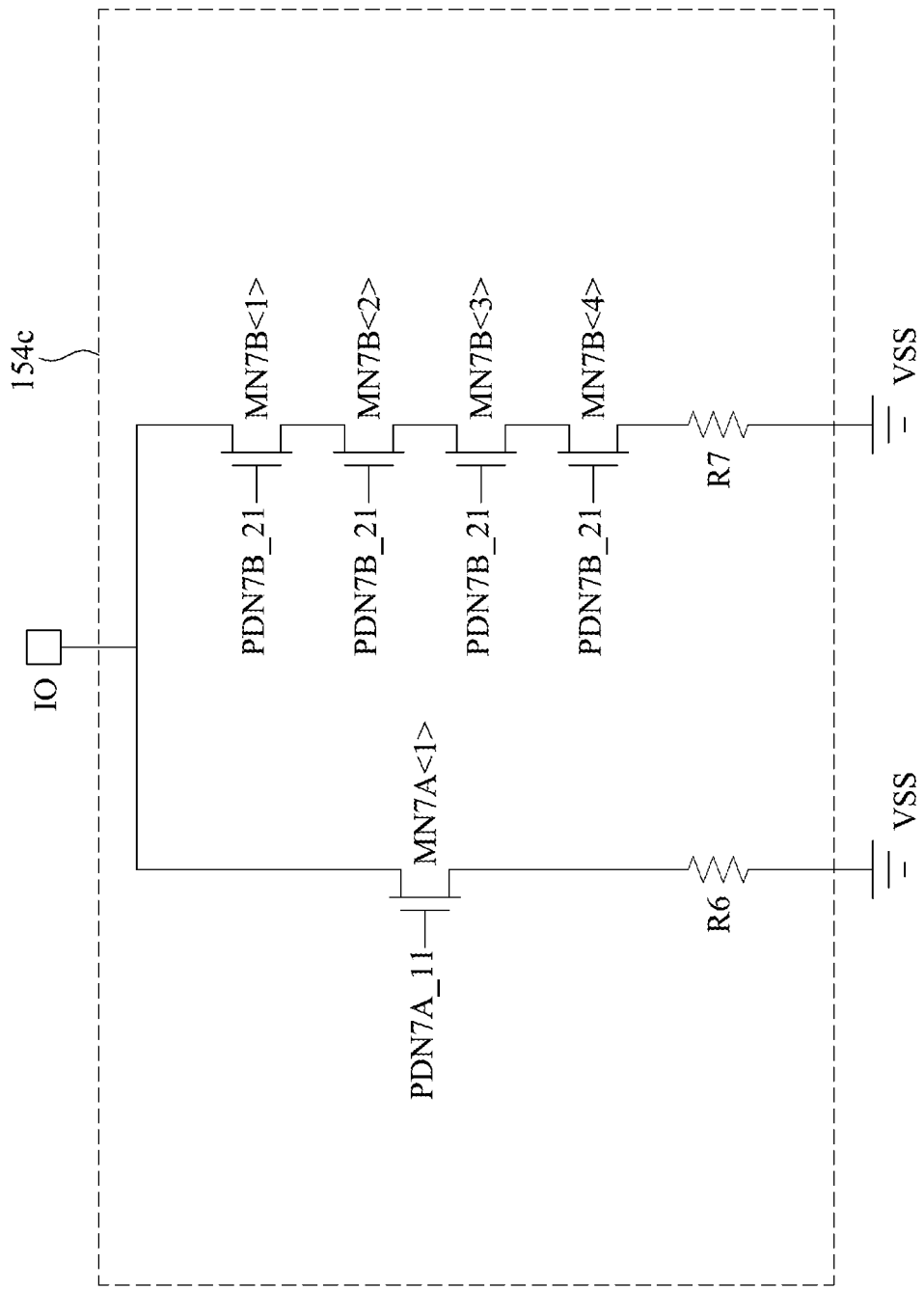

Please refer to FIG. 6C. FIG. 6C is a schematic diagram illustrating a pull-down circuit 154c in accordance with some embodiments of the present disclosure. In some embodiment, as shown in FIG. 6C, the pull-down circuit 154c can be utilized as the pull-down circuit 154 shown in FIG. 1, and the pull-down circuit 154c may be implemented by the pull-down unit 154-1 illustrated in FIG. 5A and the pull-down units 154-2 illustrated in FIG. 5B, both of which are connected between the power rail VSS and the input/output pad IO. In configurationally, when the data signal Data_IN is logic low, at least one discharging path formed by the NMOS transistors MN7A<1> and the string of the NMOS transistors MN7B<1>-MN7B<4> are configured to be conducted according to the pull-down control signal PDN7A_11 or the pull-down control signal PDN7B_21 in order to transmit the low voltage (i.e., the power rail VSS) to the input/output pad IO. Accordingly, the pull-down circuit 154c as illustrating in FIG. 6C is configured to, according to the pull-down control signals PDN7A_11 and PDN7B_21, selectively activate at least one of discharging paths between the power rail VSS and the input/output pad IO so as to provide the low voltage to the input/output pad IO. For the ease of understanding, the operation of the pull-down circuit 154c is similar the pull-down circuit illustrated in FIG. 6A and FIG. 6B, thus further explanation is omitted.

It is noticed that, the resistors R6 and R7 in the pull-down circuit 154c in FIG. 6C are not directly coupled to the input/output pad IO. If the NMOS transistors MN7A<1> and MN7B<1>-MNB7<4> are turned off, the resistors R6 and R7 are disconnected from the input/output pad IO (blocking by the NMOS transistors MN7A<1> and MN7B<1>-MNB7<4>), such that the loading effect on the input/output pad IO can be reduced.

Figure 6D:
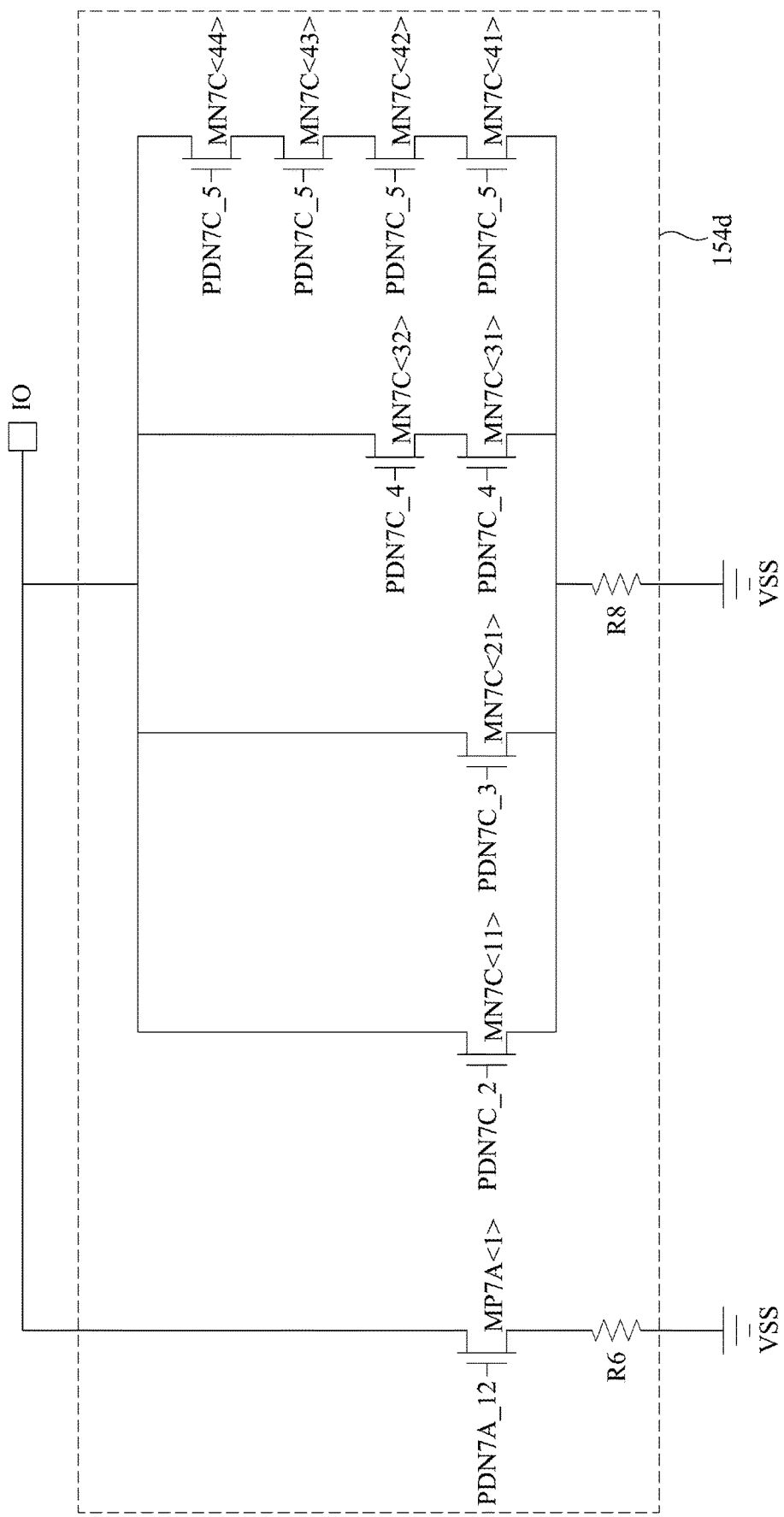

Please refer to FIG. 6D. FIG. 6D is a schematic diagram illustrating a pull-down circuit 154d in accordance with some embodiments of the present disclosure. In some embodiment, as shown in FIG. 6D, the pull-down circuit 154d can be utilized as the pull-up circuit 154 shown in FIG. 1, and the pull-down circuit 154d may be implemented by the pull-down unit 154-1 illustrated in FIG. 5A and the pull-down units 154-3 illustrated in FIG. 5C. The pull-down circuit 154d as illustrating in FIG. 6D is configured to, according to the pull-down control signals PDN7A_12, PDN7C_2, PDN7C_3, PDN7C_4, and PDN7C_5, selectively activate at least one of discharging paths between the power rail VSS and the input/output pad IO so as to provide the low voltage to the input/output pad IO. For the ease of understanding, the operation of the pull-down circuit 154d is similar the pull-down circuit illustrated in FIG. 6A to FIG. 6C, thus further explanation is omitted.

It is noticed that, the resistors R6 and R8 in the pull-down circuit 154d in FIG. 6D are not directly coupled to the input/output pad IO. If the NMOS transistors in FIG. 6D are turned off, the resistors R6 and R8 are disconnected from the input/output pad IO (blocking by the NMOS transistors), such that the loading effect on the input/output pad IO can be reduced.

It should be noted that the pull-down circuits 154a-154d shown in FIG. 6A to FIG. 6D are merely examples, and not intended to limit the present disclosure. Any circuit that implements the pull-down circuit, in which the resistor is coupled between the power rail VSS and the active component MOSFET, is within the scope of the present disclosure. That is, the design of the pull-down driving circuit 154 may be adjusted by those of ordinary skills in the art.

Figure 7:
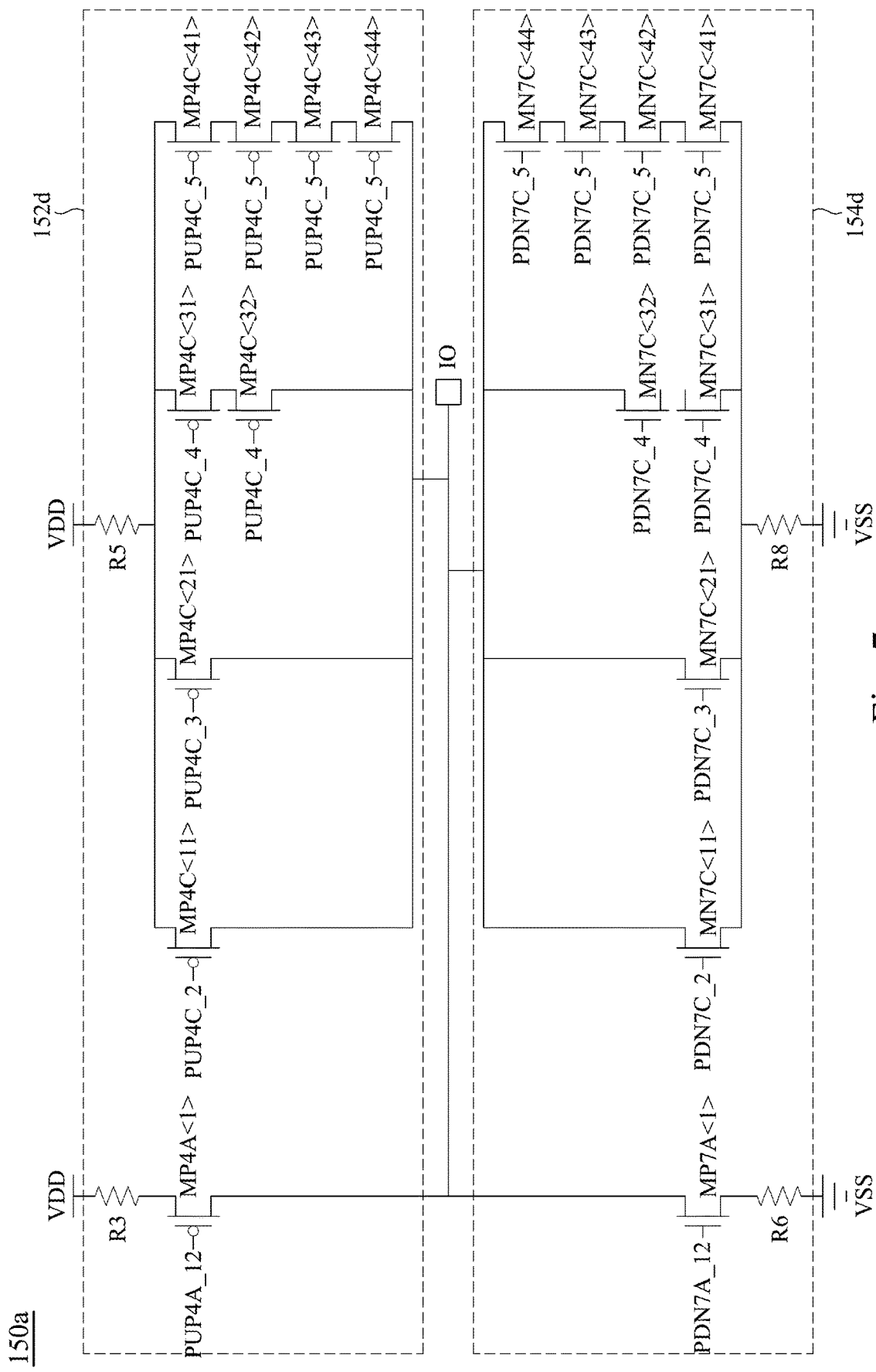
FIG. 7 is a schematic diagram illustrating an off chip driver circuit in accordance with some embodiments of the present disclosure.

Please refer to FIG. 7. FIG. 7 is a schematic diagram illustrating an off chip driver (OCD) circuit 150a in accordance with some embodiments of the present disclosure. The OCD driver circuit 150a in FIG. 7 is an embodiment of the OCD driver circuit 150 shown in FIG. 1. The OCD driver circuit 150a includes the pull-up circuit 152d as illustrated in FIG. 4D and the pull-down circuit 154d as illustrated in FIG. 6D. In configurationally, when the data signal Data_IN is logic high, at least one of the pull-up control signals PUP4A_12 or PUP4C_2-PUP4C_5 is logic low. Accordingly, the at least one of the charging path is activated in response to the pull-up control signals PUP4A_12 and PUP4C_2-PUP4C_5 and the corresponding PMOS transistors of the pull-up circuit 152d are turned on in order to provide the high voltage (e.g., VDD) to the input/output pad IO. On the other hand, when the data signal Data_IN is logic low, at least one of the pull-down control signals PDN7A_12 or PDN7C_2-PDN7C_5 is logic high. Accordingly, the at least one of the discharging path is activated in response to the pull-down control signals PDN7A_12 and PDN7C_2-PDN7C_5 and the corresponding NMOS transistors of the pull-down circuit 154d are turned on in order to provide the low voltage (e.g., VSS) to the input/output pad IO.

Figure 8:
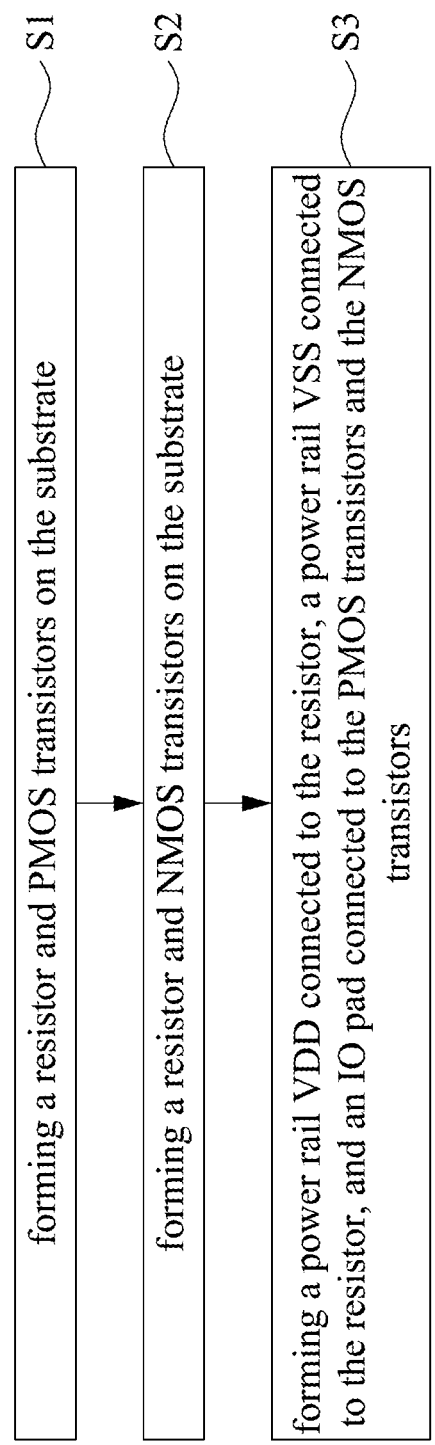
FIG. 8 is a flow chart of a method for manufacturing an off chip driver circuit in accordance with some embodiments of the present disclosure.

FIG. 8 is a flow chart of a method 800 for manufacturing an off chip driver circuit in accordance with some embodiments of the present disclosure. For ease of understanding, the method 800 is described with reference to FIG. 4D, FIG. 6D and FIG. 7. However, the method 800 is not limited to being applied to generate the above layout structures. The method 800 is able to be applied to generate any suitable layout structure. For illustration in FIG. 8, the method 800 includes steps S1, S2, S3, which will be discussed in detail below.

In step S1, with reference to FIG. 7, the resistor (e.g., the resistors R3 and R5) and the PMOS transistors (e.g., MP4A<1>, MP4C<11>, MP4C<21>, etc.) are formed on the substrate and the resistor (e.g., the resistor R5) is connected to the PMOS transistors (e.g., MP4A<1>, MP4C<11>, MP4C<21>, etc.).

In step S2, with reference to FIG. 6D and FIG. 7, the resistor (e.g., the resistors R6 and R8) and the NMOS transistors (e.g., MN7A<1>, MN7C<11>, MN7C<21>, etc.) are formed on the substrate and the resistor (e.g., the resistors R6 and R8) is connected to the NMOS transistors (e.g., MN7A<1>, MN7C<11>, MN7C<21>, etc.).)

In step S3, with reference to FIG. 4D and FIG. 7, the power rail VDD is formed and connected to the resistor (e.g., the resistors R3 and R5). The power rail VSS is formed and connected to the resistor (e.g., the resistors R6 and R8). The input/output pad IO is formed and connected to the PMOS transistors (e.g., MP4A<1>, MP4C<11>, MP4C<21>, etc.) and the NMOS transistors (e.g., MN7A<1>, MN7C<11>, MN7C<21>, etc.).

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An off chip driver circuit, comprising:
a first power rail;
a second power rail;
an input/output pad;
a pull-up circuit configured to selectively activate at least one of a plurality of charging paths between the first power rail and the input/output pad in response to a plurality of pull-up control signals, wherein the pull-up circuit comprises a first resistor and a plurality of PMOS transistors arranged on the plurality of charging paths, and the first resistor is coupled between the first power rail and the plurality of PMOS transistors, wherein the plurality of PMOS transistors comprise a plurality of first PMOS transistors connected in series and connected between the first resistor and the input/output pad, wherein the plurality of charging paths are controlled by the plurality of pull-up control signals, respectively, and the PMOS transistor(s) in each charging path are controlled by a respective one of the plurality of pull-up control signals;
a pull-down circuit configured to selectively activate at least one of a plurality of discharging paths between the second power rail and the input/output pad in response to a plurality of pull-down control signals, wherein the pull-down circuit comprises a second resistor and a plurality of NMOS transistors arranged on the plurality of discharging paths, and the second resistor is coupled between the second power rail and the plurality of NMOS transistors, wherein the plurality of NMOS transistors comprise a plurality of first NMOS transistors connected in series and connected between the second resistor and the input/output pad, wherein the plurality of discharging paths are controlled by the plurality of pull-down control signals, respectively, and the NMOS transistor(s) in each discharging path are controlled by a respective one of the plurality of pull-down control signals.

2. The off chip driver circuit of claim 1, wherein the plurality of PMOS transistors in the pull-up circuit comprises:
a second PMOS transistor connected between the first resistor and the input/output pad; and
a third PMOS transistor connected between the first resistor and the input/output pad, wherein the third PMOS transistor and the second PMOS transistor are connected in parallel,
wherein the plurality of NMOS transistors in the pull-down circuit comprises:
a second NMOS transistor connected between the second resistor and the input/output pad; and
a third NMOS transistor connected between the second resistor and the input/output pad, wherein the third NMOS transistor and the second NMOS transistor are connected in parallel.

3. The off chip driver circuit of claim 2, wherein the plurality of first PMOS transistors are connected in parallel with the second PMOS transistor,
wherein the plurality of first NMOS transistors are connected in parallel with the second NMOS transistor.

4. The off chip driver circuit of claim 3, wherein the plurality of PMOS transistors in the pull-up circuit further comprises:
a plurality of fourth PMOS transistors connected in series and connected between the first resistor and the input/output pad, and connected in parallel with the second PMOS transistor,
wherein the plurality of NMOS transistors in the pull-down circuit further comprises:
a plurality of fourth NMOS transistors connected in series and connected between the second resistor and the input/output pad, and connected in parallel with the second NMOS transistor.

5. The off chip driver circuit of claim 1, wherein the plurality of PMOS transistors in the pull-up circuit further comprises:
a plurality of second PMOS transistors connected in series and connected between the first resistor and the input/output pad, and connected in parallel with the plurality of first PMOS transistors,
wherein the plurality of NMOS transistors in the pull-down circuit further comprises:
a plurality of second NMOS transistors connected in series and connected between the second resistor and the input/output pad, and connected in parallel with the plurality of first NMOS transistors.

6. The off chip driver circuit of claim 1, wherein the plurality of PMOS transistors in the pull-up circuit further comprises:
a second PMOS transistor connected between the first resistor and the input/output pad and connected in parallel with the plurality of first PMOS transistors,
wherein the plurality of NMOS transistors in the pull-down circuit further comprises:
a second NMOS transistor connected between the second resistor and the input/output pad and connected in parallel with the plurality of first NMOS transistors.

7. The off chip driver circuit of claim 1, wherein the pull-up circuit comprises a third resistor connected to the first power rail, and the plurality of PMOS transistors in the pull-up circuit further comprises at least one second PMOS transistor connected between the third resistor and the input/output pad,
wherein the pull-down circuit comprises a fourth resistor connected to the second power rail, and the plurality of NMOS transistors in the pull-down circuit further comprises at least one second NMOS transistor connected between the fourth resistor and the input/output pad.

8. An off chip driver system, comprising:
a front-end driver circuit configured to generate a plurality of pull-up control signals and a plurality of pull-down control signals; and
an off chip driver circuit coupled to the front-end driver circuit and receive the plurality of pull-up control signals and the plurality of pull-down control signals from the front-end driver circuit, wherein the off chip driver circuit comprises:
a first power rail;
a second power rail;
an input/output pad;
a pull-up circuit configured to selectively activate at least one of a plurality of charging paths between the first power rail and the input/output pad in response to the plurality of pull-up control signals, wherein the pull-up circuit comprises a first resistor and a plurality of PMOS transistors arranged on the plurality of charging paths, and the first resistor is coupled between the first power rail and the plurality of PMOS transistors, wherein the plurality of PMOS transistors comprise a plurality of first PMOS transistors connected in series and connected between the first resistor and the input/output pad, wherein the plurality of charging paths are controlled by the plurality of pull-up control signals, respectively, and the PMOS transistor(s) in each charging path are controlled by a respective one of the plurality of pull-up control signals; and
a pull-down circuit configured to selectively activate at least one of a plurality of discharging paths between the second power rail and the input/output pad in response to the plurality of pull-down control signals, wherein the pull-down circuit comprises a second resistor and a plurality of NMOS transistors arranged on the plurality of discharging paths, and the second resistor is coupled between the second power rail and the plurality of NMOS transistors, wherein the plurality of NMOS transistors comprise a plurality of first NMOS transistors connected in series and connected between the second resistor and the input/output pad, wherein the plurality of discharging paths are controlled by the plurality of pull-down control signals, respectively, and the NMOS transistor(s) in each discharging path are controlled by a respective one of the plurality of pull-down control signals.

9. The off chip driver circuit of claim 8, wherein the plurality of PMOS transistors in the pull-up circuit comprises:
a second PMOS transistor connected between the first resistor and the input/output pad; and
a third PMOS transistor connected between the first resistor and the input/output pad, wherein the third PMOS transistor and the second PMOS transistor are connected in parallel,
wherein the plurality of NMOS transistors in the pull-down circuit comprises:
a second NMOS transistor connected between the second resistor and the input/output pad; and
a third NMOS transistor connected between the second resistor and the input/output pad, wherein the third NMOS transistor and the second NMOS transistor are connected in parallel.

10. The off chip driver circuit of claim 9, wherein the plurality of first PMOS transistors are connected in parallel with the second PMOS transistor,
wherein the plurality of first NMOS transistors are connected in parallel with the second NMOS transistor.

11. The off chip driver circuit of claim 10, wherein the plurality of PMOS transistors in the pull-up circuit further comprises:

a plurality of fourth PMOS transistors connected in series and connected between the first resistor and the input/output pad, and connected in parallel with the second PMOS transistor,
wherein the plurality of NMOS transistors in the pull-down circuit further comprises:
a plurality of fourth NMOS transistors connected in series and connected between the second resistor and the input/output pad, and connected in parallel with the second NMOS transistor.

12. The off chip driver circuit of claim 8, wherein the plurality of PMOS transistors in the pull-up circuit further comprises:
a plurality of second PMOS transistors connected in series and connected between the first resistor and the input/output pad, and connected in parallel with the plurality of first PMOS transistors,
wherein the plurality of NMOS transistors in the pull-down circuit further comprises:
a plurality of second NMOS transistors connected in series and connected between the second resistor and the input/output pad, and connected in parallel with the plurality of first NMOS transistors.

13. The off chip driver circuit of claim 8, wherein the plurality of PMOS transistors in the pull-up circuit further comprises:
a second PMOS transistor connected between the first resistor and the input/output pad and connected in parallel with the plurality of first PMOS transistors,
wherein the plurality of NMOS transistors in the pull-down circuit further comprises:
a second NMOS transistor connected between the second resistor and the input/output pad and connected in parallel with the plurality of first NMOS transistors.

14. The off chip driver circuit of claim 8, wherein the pull-up circuit comprises a third resistor connected to the first power rail, and the plurality of PMOS transistors in the pull-up circuit further comprises at least one second PMOS transistor connected between the third resistor and the input/output pad,
wherein the pull-down circuit comprises a fourth resistor connected to the second power rail, and the plurality of NMOS transistors in the pull-down circuit further comprises at least one second NMOS transistor connected between the fourth resistor and the input/output pad.

15. A method for manufacturing an off chip driver circuit, comprising:
forming a first resistor and a plurality of PMOS transistors on a substrate, comprising:
forming a plurality of first PMOS transistors connected in series and connected between the first resistor and an input/output pad on the substrate;
forming a second resistor and a plurality of NMOS transistors on the substrate, comprising:
forming a plurality of first NMOS transistors connected in series and connected between the second resistor and the input/output pad on the substrate; and
forming a first power rail connected to the first resistor, a second power rail connected to the second resistor, and the input/output pad connected to the plurality of PMOS transistors and the plurality of NMOS transistors,
wherein the plurality of PMOS transistors are arranged on a plurality of charging paths between the first power rail and the input/output pad, the plurality of charging paths are controlled by a plurality of pull-up control signals, respectively, and the PMOS transistor(s) in each charging path are controlled by a respective one of the plurality of pull-up control signals, wherein the plurality of NMOS transistors are arranged on a plurality of discharging paths between the second power rail and the input/output pad, the plurality of discharging paths are controlled by a plurality of pull-down control signals, respectively, and the NMOS transistor(s) in each discharging path are controlled by a respective one of the plurality of pull-down control signals.

16. The method of claim 15, wherein the forming the first resistor and the plurality of PMOS transistors on the substrate further comprises:

forming a second PMOS transistor on the substrate, to couple between the first resistor and the input/output pad; and forming a third PMOS transistor on the substrate, to couple between the first resistor and the input/output pad, wherein the third PMOS transistor and the second PMOS transistor are connected in parallel; and wherein the forming the second resistor and the plurality of NMOS transistors on the substrate further comprises:

forming a second NMOS transistor on the substrate, to couple between the second resistor and the input/output pad; and forming a third NMOS transistor on the substrate, to couple between the second resistor and the input/output pad, wherein the third NMOS transistor and the second NMOS transistor are connected in parallel.

17. The method of claim 16, wherein the plurality of first PMOS transistors are connected in parallel with the second PMOS transistor;

wherein the plurality of first NMOS transistors are connected in parallel with the second NMOS transistor.

18. The method of claim 17, wherein the forming the first resistor and the plurality of PMOS transistors on the substrate further comprises:

forming a plurality of fourth PMOS transistors connected in series on the substrate and connected between the first resistor and the input/output pad, wherein the fourth PMOS transistors are connected in parallel with the second PMOS transistor;

wherein the forming the second resistor and the plurality of NMOS transistors on the substrate further comprises:

forming a plurality of fourth NMOS transistors connected in series and connected between the second resistor and the input/output pad on the substrate, wherein the fourth NMOS transistors are connected in parallel with the second NMOS transistor.

19. The method of claim 15, wherein the forming the first resistor and the plurality of PMOS transistors on the substrate further comprises:

forming a plurality of second PMOS transistors connected in series and connected between the first resistor and the input/output pad on the substrate, wherein the plurality of second PMOS transistors are connected in parallel with the plurality of first PMOS transistors;

wherein the forming the second resistor and the plurality of NMOS transistors on the substrate further comprises:

forming a plurality of second NMOS transistors connected in series and connected between the second resistor and the input/output pad on the substrate, wherein the plurality of second NMOS transistors are connected in parallel with the plurality of first NMOS transistors.

20. The method of claim 15, further comprising:

forming a third resistor and at least one second PMOS transistor on the substrate, wherein the third resistor and the at least one second PMOS transistor are connected in series and connected between the first power rail and the input/output pad; and forming a fourth resistor and at least one second NMOS transistor on the substrate, wherein the fourth resistor and the at least one second NMOS transistor are connected in series and connected between the second power rail and the input/output pad.

* * * * *